United States Patent [19]

Nakamura et al.

[11] Patent Number: 5,355,034
[45] Date of Patent: Oct. 11, 1994

[54] DRIFT SUPPRESSING CIRCUIT OF GYROSCOPE

[75] Inventors: Takeshi Nakamura; Akira Mori, both of Nagaokakyo, Japan

[73] Assignee: Murata Manufacturing Co., Ltd., Kyoto, Japan

[21] Appl. No.: 83,888

[22] Filed: Jun. 28, 1993

[30] Foreign Application Priority Data

Jun. 29, 1992 [JP] Japan .................................. 4-196580
Aug. 24, 1992 [JP] Japan .................................. 4-248534

[51] Int. Cl.⁵ .............................................. H03K 5/24
[52] U.S. Cl. .................................... 307/491; 307/494; 307/352; 307/359; 33/326
[58] Field of Search ............... 307/351, 352, 353, 359, 307/358, 360, 491, 494, 362, 355; 328/150, 151, 129.1; 33/326

[56] References Cited

U.S. PATENT DOCUMENTS

| | | | |
|---|---|---|---|
| 4,814,714 | 5/1989 | Beadle | 307/352 |
| 4,833,345 | 5/1989 | Miller | 307/353 |
| 5,087,843 | 2/1992 | Narabu et al. | 307/359 |
| 5,159,340 | 10/1992 | Smith | 307/351 |

FOREIGN PATENT DOCUMENTS 285538 12/1990 German Democratic Rep. .................................. 358/171

Primary Examiner—Timothy P. Callahan
Assistant Examiner—My-Trang Nu Ton
Attorney, Agent, or Firm—Nikaido, Marmelstein, Murray & Oram

[57] ABSTRACT

An output signal of a gyroscope is input to two differential circuits having different characteristics in a high frequency band. Output signals of the differential circuits are compared in a comparison circuit, and the output signal of the gyroscope at the time when the output signals of the two differential circuits are equal is output from a sampling hold circuit. In the two differential circuits, the difference of the output signal of the gyroscope and an output signal of the sampling hold circuit is output. The output signal of the gyroscope may be input to a time constant circuit having a switching function and a hold function. At this time, the difference of the output signal of the gyroscope and the output signal of the time constant circuit is output from the differential circuit. The output signal of the differential circuit is compared with a reference voltage generated in a reference voltage circuit in a comparator. The switching function of the time constant circuit is controlled by an output signal of the comparator.

11 Claims, 5 Drawing Sheets

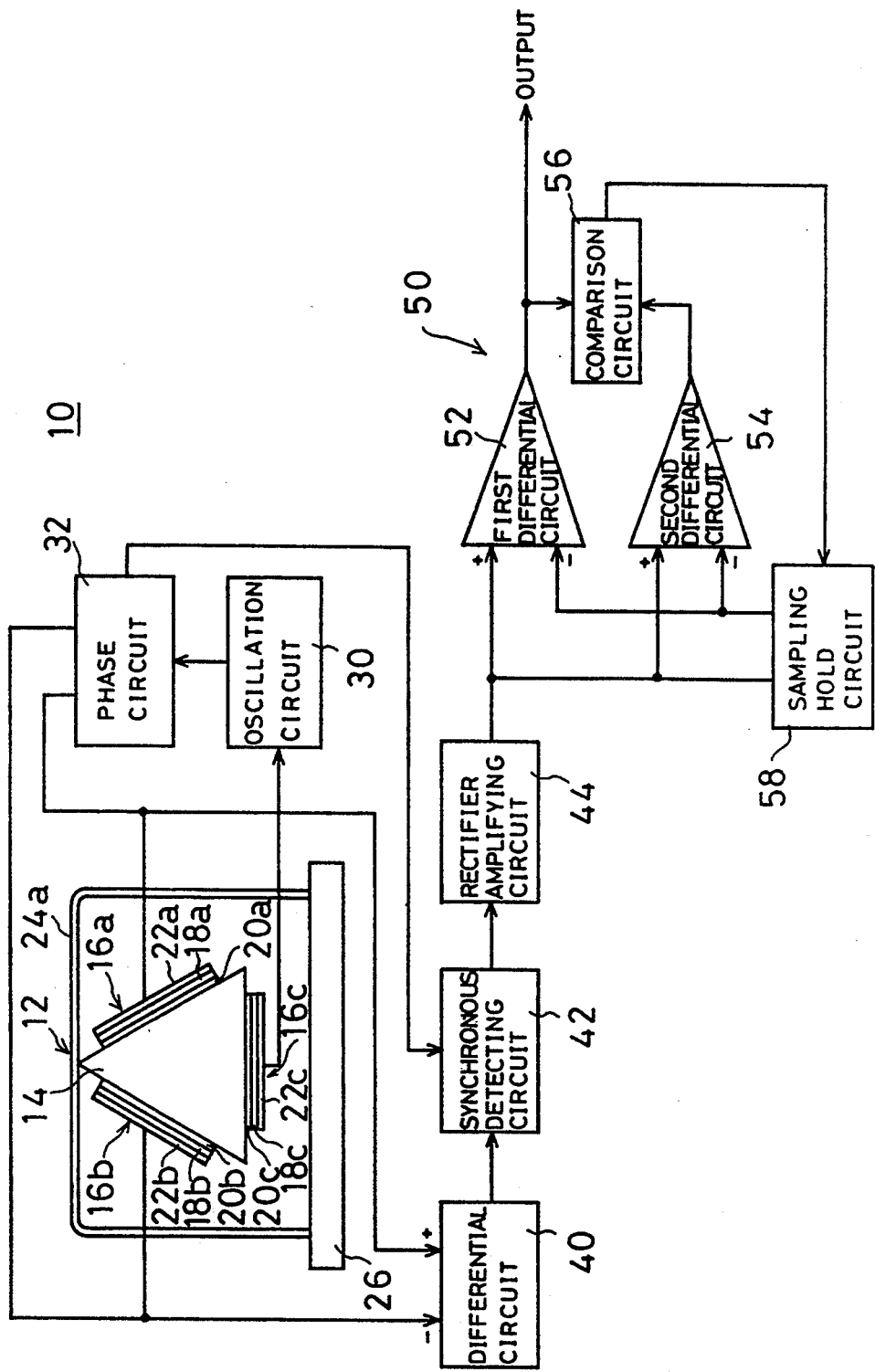
F I G. 1

F I G. 5 (A)
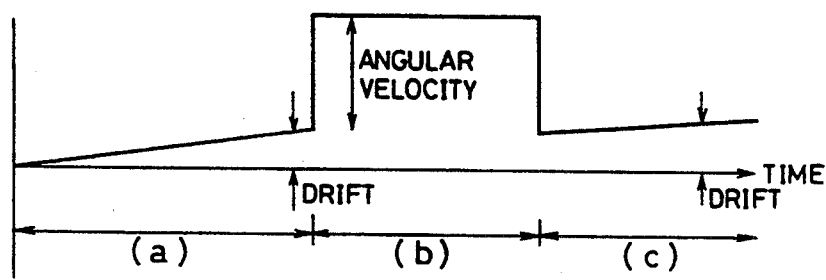
F I G. 5 (B)
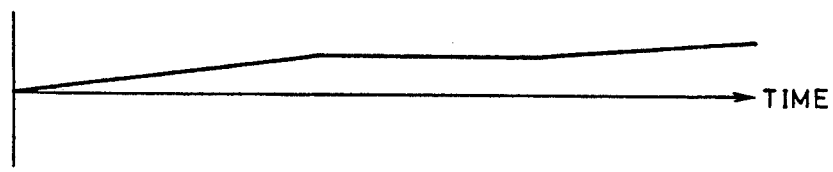
F I G. 5 (C)
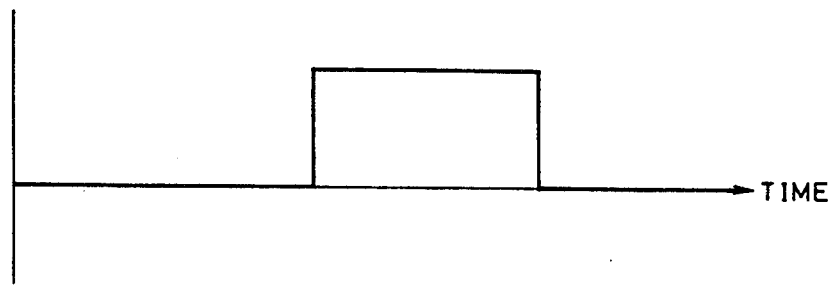

DRIFT SUPPRESSING CIRCUIT OF GYROSCOPE

BACKGROUND OF THE INVENTION

1. Field of the Invention

The present invention relates to a drift suppressing circuit of a gyroscope, particularly, it relates to a drift suppressing circuit of a gyroscope capable of suppressing drift components produced in the gyroscopes such as a vibrating gyroscope, an optional fiber type, a gas rate type and a rotational gyroscope which can detect a rotational angular velocity.

2. Description of the Prior Art

As a conventional vibrating gyroscope which is a background of the present invention, for example, the vibrating gyroscope, using a vibrator in which piezoelectric elements are respectively formed on three side faces of a triangular prism-shaped vibrating body, is known. In this vibrating gyroscope, for example, two piezoelectric elements are used for driving and detection and the other one piezoelectric element is used for feedback.

In such a vibrating gyroscope, when a driving signal is given from one piezoelectric element for feedback to the two driving piezoelectric elements, the vibrating body bends and vibrates. When the vibrator is rotated in such a bending and vibrating state of the vibrating body, a vibrating direction changes due to a Coriolis force and an output difference is produced between the two detecting piezoelectric elements. Thus, by measuring an output signal corresponding to the output difference, the rotational angular velocity is detected.

However, in the conventional vibrating gyroscope, due to the drift components produced by changes in environmental temperature and the like, errors are produced in the output signal, thus there is the possibility of producing errors in the detected rotational angular velocity.

Therefore, the inventor has devised a gyroscope capable of suppressing such drift components. The gyroscope comprises, an angular velocity sensor, a signal generating circuit which generates an AC signal and a composing circuit for composing the output signal of the angular velocity sensor and the AC signal generated in the signal generating circuit.

In this gyroscope, a signal corresponding to the rotational angular velocity to be detected and the drift components are output from the angular velocity sensor. Also, the AC signal is generated in the signal generating circuit. The output signal of the angular velocity sensor and the AC signal generated in the signal generating circuit are composed in the composing circuit.

When the rotational angular velocity is not applied to the angular velocity sensor, a signal corresponding to the rotational angular velocity to be detected becomes zero, and the output of the composing circuit becomes a composite signal of the drift components and the AC signal generated in the signal generating circuit. A point where an AC signal component in the composite signal becomes zero is detected, and the output of the angular velocity sensor at that point of time is regarded as the drift components.

When a correction signal corresponding to the drift components is subtracted from the output of the angular velocity sensor, the drift components are suppressed.

In this gyroscope, the drift components can be suppressed. Hence, when this gyroscope is used, even when the drift components are included in the output signal of the angular velocity sensor, the rotational angular velocity can be detected substantially without errors.

However, in this gyroscope, a circuit configuration becomes complicated because complicated circuits such as the signal generating circuit are used.

Furthermore, in this gyroscope, since the AC signal is superposed on the output signal of the angular velocity sensor to suppress the drift components, a minimum resolving power is deteriorated by an AC signal level.

SUMMARY OF THE INVENTION

It is, therefore, a primary object of the present invention to provide a drift suppressing circuit of gyroscope a which has a simple constitution and a good resolving power.

The present invention is directed to the drift suppressing circuit of a gyroscope for suppressing drift components included in an output of the gyroscope comprising, a first differential circuit having a substantialy flat frequency characteristic wherein the output of the gyroscope is given to one input terminal of the first differential circuit, a second differential circuit whose frequency characteristic on the higher frequency side above a specific frequency is different from the frequency characteristic of the first differential circuit wherein the output of the gyroscope is given to one input terminal of the second differential circuit, a comparison circuit for comparing the output of the first differential circuit and the output of the second differential circuit, and a sampling hold circuit for giving a correction signal corresponding to the output of the gyroscope at the time when the output of the first differential circuit and the output of the second differential circuit compared by the comparison circuit are substantially equal to another input terminal of the first differential circuit and to another input terminal of the second differential circuit.

The output signal of the gyroscope is given to one input terminal of the first differential circuit. The output signal of the gyroscope is also given to one input terminal of the second differential circuit.

In the comparison circuit, the output signal of the first differential circuit and the output signal of the second differential circuit are compared.

The correction signal corresponding to the output signal of the gyroscope at the time when the output signal of the first differential circuit and the output signal of the second differential circuit compared in the comparison circuit are substantially equal, is given to another input terminal of the first differential circuit and to another input terminal of the second differential circuit by the sampling hold circuit.

Descriptions are provided for two examples, one example being where the rotational angular velocity is applied to the gyroscope, and the other example being where the rotational angular velocity is not applied.

In the first example of not applying the rotational angular velocity to the gyroscope, the output signal of the gyroscope includes only the drift components. Since the drift components are a low frequency, the output signal of the first differential circuit and the output signal of the second differential circuit are substantially equal. Hence, the correction signal corresponding to the output signal of the gyroscope at that time, that is, the drift components is given to another input terminal of the first differential circuit and to another input terminal of the second differential circuit by the sampling hold circuit. In this example, even when the magnitude of the drift components changes, the magnitude of the correction signal also changes following the change of the drift components. Thus, the drift components are suppressed and the output of the first differential circuit always becomes zero.

In the second example of applying the rotational angular velocity to the gyroscope, the output signal of the gyroscope becomes the signal corresponding to the rotational angular velocity and the drift components. Since the signal corresponding to the rotational angular velocity is a high frequency, the output signal of the first differential circuit and the output signal of the second differenial circuit are different from each other. Hence, the signal corresponding to the output signal of the gyroscope at that time is not output to another input terminal of the first differential circuit and to another input terminal of the second differential circuit by the sampling hold circuit, but the correction signal corresponding to the prior drift components is output. Hence, the output of the first differential circuit becomes the signal corresponding to the rotational angular velocity.

As such, in the drift suppressing circuit of the gyroscope, the signal in which the drift components included in the output of the gyroscope is suppressed, that is, the signal corresponding to the rotational angular velocity is output from the first differential circuit.

The present invention is also directed to the drift suppressing circuit of a gyroscope for suppressing drift components included in an output of the gyroscope comprising, a time constant circuit having a switching function for controlling an input from the gyroscope and a hold function for holding the input from the gyroscope and outputting a signal at a time constant for the input signal, a differential circuit for outputting the difference of the output of the gyroscope and the output of the time constant circuit, a reference voltage circuit for generating a reference voltage for distinguishing the output of the gyroscope and the drift components, and a comparator for comparing the reference voltage generated in the reference voltage circuit and the output of the differential circuit to switch the time constant circuit.

The output signal of the gyroscope is controlled to be input to the time constant circuit by the switching function of the time constant circuit. The difference of the output signal of the gyroscope and the output signal of the time constant circuit is output by the differential circuit. The output signal of the differential circuit and the reference voltage generated in the reference voltage circuit is compared, and switching of the time constant circuit is controlled by this compared value. When input to the time constant circuit is stopped, by the hold function, the time constant circuit maintains the state which is just before the input is stopped.

Since the drift components are the gradual output change, when the drift components are input to the time constant circuit, a substantially same signal as the input signal is output from the time constant circuit. When the gyroscope is rotated, its output signal becomes a mixed output of the output signal responding to the rotational angular velocity and the drift components. Since the output signal responding to the rotational angular velocity is the sudden change, the output signal of the time constant circuit does not respond to the signal responding to the rotational angular velocity in a short time.

Hence, a large output signal is obtained from the differential circuit, and by comparing this output signal with the reference voltage, the switching function of the time constant circuit is controlled and input to the time constant circuit is controlled.

That is, when the output signal from the gyroscope is only the drift components, the difference of the output signal of the gyroscope and the output signal of the time constant circuit obtained in the differential circuit becomes substantially zero. Thus, the drift components produced in the gyroscope can be eliminated. When applying the rotational angular velocity to the gyroscope, the difference of the output signal of the differential circuit and the output signal of the time constant circuit becomes larger, and the switching function of the time constant circuit is controlled. At this time, when it is set to stop input to the time constant circuit, by the hold function of the time constant circuit, the output signal before inputting the signal responding to the rotational angular velocity, that is, the output signal with only the drift components is output from the time constant circuit. Thus, the output signal obtained by subtracting the drift components from the output signal of the gyroscope is obtained from the differential circuit. Thus, when the drift suppressing circuit of the gyroscope is used, the drift components included in the output signal of the gyroscope can be eliminated, and an accurate rotational angular velocity can be detected.

According to the present invention, since complicated circuits such as a signal generating circuit and the like are not used, the drift suppressing circuit of the gyroscope has a simple configuration.

Besides, in the drift suppressing circuit of the gyroscope according to the present invention, since the magnitude of the correction signal changes following the changes in the magnitude of the drift components when not applying the rotational angular velocity to the gyroscope, a suppressing range of the drift components is broadened. Since the AC signal is not superposed on the output signal of the gyroscope, the resolving power is improved.

The above and other objects, features, aspects and advantages of the present invention will become more apparent from the following detailed description of the embodiments made with reference to the drawings.

BRIEF DESCRIPTION OF THE DRAWINGS

FIG. 1 is a block diagram showing a vibrating gyroscope as one embodiment of the present invention.

FIG. 5(A) is a graph showing an output signal of a rectifier amplifying circuit, FIG. 5(B) is a graph showing an output signal of a time constant circuit and FIG. 5(C) is a graph showing an output signal of a differential circuit.

DESCRIPTION OF THE EMBODIMENTS

Figure 2:
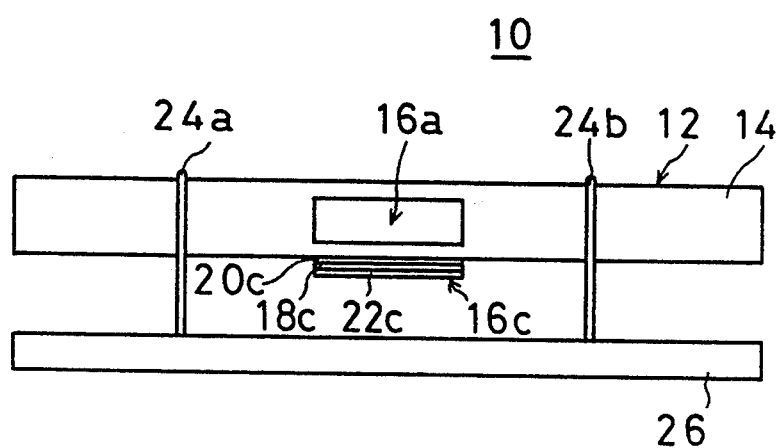
FIG. 2 is a side view showing a vibrator and its peripheral portion of a vibrating gyroscope shown in FIG. 1.

FIG. 1 is a block diagram showing an example of a vibrating gyroscope as one embodiment of the present invention. FIG. 2 is a side view showing a vibrator and its peripheral portion of a vibrating gyroscope shown in FIG. 1. Though the present invention relates to a drift suppressing circuit of a gyroscope, in this embodiment, one example of the vibrating gyroscope using the same is described.

The vibrating gyroscope 10 includes a vibrator 12 as an angular velocity sensor, and the vibrator 12 includes, for example, a right triangular prism-shaped vibrating body 14. The vibrating body 14 is formed by, generally, a material producing a mechanical vibration such as elinvar, iron-nickel alloy, quartz, glass, crystal, ceramics and the like.

On the vibrating body 14, at the center of its three side faces, piezoelectric elements 16a, 16b and 16c are formed respectively. The piezoelectric element 16a includes a piezoelectric layer 18a consisting of, for example, ceramics, and on both surfaces of the piezoelectric layer 18a, electrodes 20a and 22a are formed respectively. The electrodes 20a and 22a are formed by an electrode material such as gold, silver, aluminum, nickel, copper-nickel alloy (Monel Metal) and the like, by a thin film technique such as a sputtering, a vacuum evaporation and the like, or depending on the material, by a printing technique. Similarly, the other piezoelectric elements 16b and 16c respectively include piezoelectric layers 18b and 18c consisting of, for example, ceramics, and on both surfaces of the piezoelectric layers 18b and 18c, electrodes 20b and 22b and electrodes 20c and 22c are formed respectively. One electrode 20a–20c of the piezoelectric elements 16a–16c is bonded to the vibrating body 14 by means of, for example, an adhesives.

The vibrating body 14 is supported respectively by U-shaped support members 24a and 24b consisting of, for example, a metal wire in the vicinity of its two nodal points. Center portions of the support members 24a and 24b are respectively fixed to the vibrating body 14 in the vicinity of its two nodal points by means of, for example, welding or bonding with a conductive paste. End portions of the support members 24a and 24b are fixed to one surface of a support plate 26.

In the vibrator 12, for example, the two piezoelectric elements 16a and 16b are used for driving and detection, and the other piezoelectric element 16c is used for feedback. When output from the piezoelectric element 16c for feedback is amplified and a driving signal is applied to the piezoelectric elements 16a and 16b for driving, the vibrating body 14 bends and vibrates, thereby a similar wave-form is output from the piezoelectric elements 16a and 16b. When the vibrator 12 is rotated about its axis in that state, a vibrating direction of the vibrating body 14 changes due to the Coriolis force. Hence, the output signal of one detecting piezoelectric element becomes larger according to the rotational angular velocity, and conversely, the output signal of the other detecting piezoelectric element becomes smaller according to the rotational angular velocity.

Between the electrode 22c of the feedback piezoelectric element 16c and the electrodes 22a and 22b of the driving piezoelectric elements 16a and 16b of the vibrator 12, an oscillation circuit 30 and a phase circuit 32 are connected as a feedback loop for self-oscillation drive of the vibrator 12.

The piezoelectric element 16a and the piezoelectric element 16b are respectively connected to two input terminals of a differential circuit 40. The differential circuit 40 includes, for example, an operational amplifier. The electrodes 22a and 22b of the piezoelectric elements 16a and 16b are respectively connected to a non-inverse input terminal and an inverse input terminal of the operational amplifier. The differential circuit 40 is designed to detect the output difference of the piezoelectric elements 16a and 16b.

An output terminal of the differential circuit 40 is connected to an input terminal of a synchronous detecting circuit 42. The phase circuit 32 is connected to another input terminal of the synchronous detecting circuit 42. The synchronous detecting circuit 42 is designed to detect the output of the differential circuit 40 in synchronism with the driving signal of the vibrator 12.

An output terminal of the synchronous detecting circuit 42 is connected to an input terminal of a rectifier amplifying circuit 44. The rectifier amplifying circuit 44 is designed to rectify and amplify the output of the synchronous detecting circuit 42.

An output terminal of the rectifier amplifying circuit 44 of the vibrating gyroscope 10 is connected to a non-inverse input terminal of a first differential circuit 52 of a drift suppressing circuit 50. The first differential circuit 52 has a substantially flat frequency characteristic i.e. has a same frequency characteristic for all frequencies. Hence, the first differential circuit 52 outputs the signal obtained by subtracting the input signal, at the inverse input terminal, from the input signal, at the non-inverse input terminal for all frequencies. The first differential circuit 52 is designed to subtract the correction signal corresponding to the drift components from the output signal of the rectifier amplifying circuit 44 of the vibrating gyroscope 10.

The output terminal of the rectifier amplifying circuit 44 is connected to a non-inverse input terminal of a second differential circuit 54. Compared to the first differential circuit 52, the second differential circuit 54 has a different frequency characteristic on the high frequency side above a specific frequency. In this embodiment, the second differential circuit 54 outputs an amplified signal in the high frequency band as compared to the first differential circuit 52.

An output terminal of the first differential circuit 52 and an output terminal of the second differential circuit 54 are respectively connected to one input terminal and to another input terminal of a comparison circuit 56. The comparison circuit 56 is designed to compare an output signal of the first differential circuit 52 and an output signal of the second differential circuit 54.

In this embodiment, the comparison circuit 56 outputs, for example, a Vcc/2 (V) signal which is one half of a supply voltage Vcc(V) of the comparison circuit 56, when an input signal to one input terminal and an input signal to another input terminal are substantially equal. Thus, the comparison circuit 56 outputs the Vcc/2 (V) signal when the output signal of the first differential circuit 52 and the output signal of the second differential circuit 54 are substantially equal.

The comparison circuit 56 outputs, for example, the Vcc(V) signal, when the input signal to one input terminal is smaller than the input signal to another input terminal. Thus, the comparison circuit 56 outputs the Vcc(V) signal when the output signal of the first differential circuit 52 is smaller than the output signal of the second differential circuit 54.

The comparison circuit 56 outputs, for example, a 0 (V) signal, when the input signal to one input terminal is larger than the input signal to another input terminal. Thus, the comparison circuit 56 outputs the 0 (V) signal when the output signal of the first differential circuit 52 is larger than the output signal of the second differential circuit 54.

An output terminal of the comparison circuit 56 is connected to an input terminal of a sampling hold circuit 58. The output terminal of the rectifier amplifying circuit 44 of the vibrating gyroscope 10 is connected to another input terminal of the sampling hold circuit 58. An output terminal of the sampling hold circuit 58 is connected to an inverse input terminal of the first differential circuit 52 and to an inverse input terminal of the second differential circuit 54.

The sampling hold circuit 58 is designed to give the output of the rectifier amplifying circuit 44 of the gyroscope 10 at the time when the output of the first differential circuit 52 and the output of the second differential circuit 54 compared by the comparison circuit 56 is substantially equal, that is, the correction signal corresponding to the drift components to the inverse input terminal of the first differential circuit 52 and to the inverse input terminal of the second differential circuit 54.

In this embodiment, the sampling hold circuit 58 outputs the output signal of the rectifier amplifying circuit 44 at that time, that is, the correction signal corresponding to the drift components, only when the Vcc/2 (V) signal is input to its input terminal. When the magnitude of the drift components changes, the magnitude of the correction signal also changes following the change of the drift components.

The sampling hold circuit 58 retains and outputs the prior correction signal when the signal other than the Vcc/2 (V) signal, for example, the Vcc(V) or 0 (V) signal is input to its input terminal. In this case, the sampling hold circuit 58 keeps the output of the correction signal till the next Vcc/2 (V) signal is input to its input terminal. When the next Vcc/2 (V) signal is input to its input terminal, the sampling hold circuit 58 outputs the correction signal corresponding to the drift components at that time.

Next, the operation of the vibrating gyroscope 10 is described.

Since the output signal of the feedback piezoelectric element 16c of the vibrator 12 is fed back to the driving piezoelectric elements 16a and 16b by the oscillation circuit 30 and the phase circuit 32 as the feedback loop, the vibrating gyroscope 10 is subjected to self-oscillation drive.

A first example where the rotational angular velocity is applied to the vibrating gyroscope 10 and a second example where not applied are described.

In the first example of not applying the rotational angular velocity to the vibrating gyroscope 10, for example, a low frequency drift component which becomes larger as time elapses is output from the output terminal of the rectifier amplifying circuit 44.

The drift component is input to the non-inverse input terminal of the first differential circuit 52, to the non-inverse input terminal of the second differential circuit 54 and to the sampling hold circuit 58 of the drift suppressing circuit 50.

Since the drift component is the low frequency, a output signal of the first differential circuit 52 and that of the second differential circuit 54 are substantially equal.

Hence, the input signal to one input terminal of the comparison circuit 56 and that to another input terminal become substantially equal, and the comparison circuit 56 outputs the Vcc/2 (V) signal.

The Vcc/2 (V) signal is input to the sampling hold circuit 58. The sampling hold circuit 58 takes in and outputs the output signal of the rectifier amplifying circuit 44 at that time, that is, the correction signal corresponding to the drift component. In this case, even when the magnitude of the drift component changes, the magnitude of the correction signal changes also following the change of the drift component.

The correction signal is input to the inverse input terminal of the first differential circuit 52 and the inverse input terminal of the second differential circuit 54. Thus, the drift component is suppressed by the correction signal and the output of the first differential circuit 52 always becomes zero.

In the second example of applying the rotational angular velocity to the vibrating gyroscope 10, the output signal of the rectifier amplifying circuit 44 becomes a high frequency signal corresponding to the rotational angular velocity and a low frequency drift component.

The output signal of the rectifier amplifying circuit 44 is input to the non-inverse input terminal of the first differential circuit 52, to the non-inverse input terminal of the second differential circuit 54 and to the sampling hold circuit 58 of the drift suppressing circuit 50.

Since the signal corresponding to the rotational angular velocity mentioned above is a high frequency, the output signal of the second differential circuit 54 is larger than that of the first differential circuit 52.

Hence, the input signal to one input terminal of the comparison circuit 56 becomes smaller than that to another input terminal, and the comparison circuit 56 outputs the Vcc(V) signal.

Though the Vcc(V) signal is input to the sampling hold circuit 58, the sampling hold circuit 58 continues to output the prior output signal of the rectifier amplifying circuit 44 of the vibrating gyroscope 10, that is, the correction signal corresponding to the drift component.

The correction signal is input to the inverse input terminal of the first differential circuit 52 and to the inverse input terminal of the second differential circuit 54. Thus, the drift component is suppressed by the correction signal, and the output signal of the first differential circuit 52 becomes the signal corresponding to the rotational angular velocity.

As such, in the drift suppressing circuit 50, the signal obtained by suppressing the drift component from the output signal of the rectifier amplifying circuit 44 of the vibrating gyroscope 10, that is, the signal corresponding to the rotational angular velocity is output from the first differential circuit 52.

In the above-mentioned embodiment, though the second differential circuit which outputs an amplified signal in a high frequency band is used, in place of the second differential circuit, a second differential circuit which outputs an attenuated signal in the high frequency band may be used. In this case, though outputs of the second differential circuit and the comparison circuit differ as the case may be, the other circuits operate the same as the above-mentioned embodiment.

In the above-mentioned embodiment, though the output terminal of the rectifier amplifying circuit 44 is connected to the non-inverse input terminals of the first differential circuit 52 and the second differential circuit 54, and the output terminal of the sampling hold circuit 58 is connected to the inverse input terminals of the first differential circuit 52 and the second differential circuit 54, the output terminal of the sampling hold circuit 58 may be connected to the non-inverse input terminals of the first differential circuit 52 and the second differential circuit 54, and the output terminal of the rectifier amplifying circuit 44 may be connected to the inverse input terminals of the first differential circuit 52 and the second differential circuit 54. In this case, though the polarity is reversed, the drift component is suppressed by the correction signal, and the output signal of the first differential circuit 52 becomes the signal corresponding to the rotational angular velocity.

Meanwhile, though the comparison circuit outputting the Vcc/2 (V) signal, Vcc(V) signal or 0 (V) signal is used in the above-mentioned embodiment, in place of the comparison circuit, a comparison circuit capable of detecting that the output signal of the first differential circuit and the output signal of the second differential circuit are substantially equal, and outputting the other signal may be used. In this case, the sampling hold circuit may be constituted so as to operate by the signal output from the comparison circuit. The comparison circuit or the sampling hold circuit may be constituted by combining a plural number of circuits.

Figure 3:
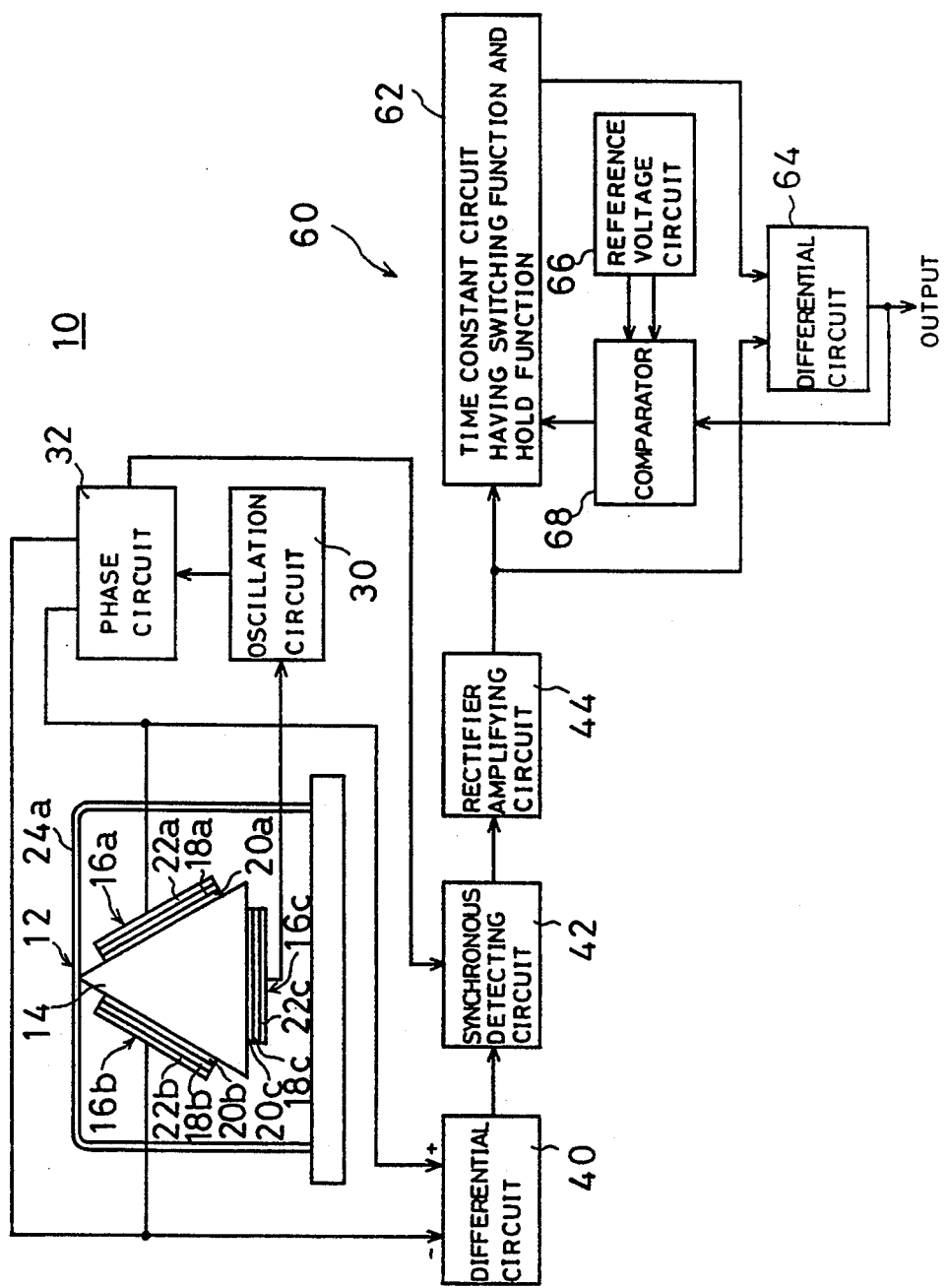
FIG. 3 is a block diagram showing a vibrating gyroscope as another embodiment of the present invention.

FIG. 3 is a block diagram showing an example of another drift suppressing circuit. The output signal of the rectifier amplifying circuit 44 is input to a drift suppressing circuit 60. The drift suppressing circuit 60 includes a time constant circuit 62. The time constant circuit 62 is designed to output the input signal at the time constant. The time constant circuit 62 includes a switching function and a hold function. The switching function is for controlling the signal which is input to the time constant circuit. The hold function is for retaining a value corresponding to the input signal to the time constant circuit, and outputting a constant output signal responding to the value. Furthermore, the drift suppressing circuit 60 includes a differential circuit 64. The rectifier amplifying circuit 44 and the time constant circuit 62 are connected to the differential circuit 64, and the difference in these output signals is detected.

A reference voltage circuit 66 is disposed for generating a reference voltage for controlling the switching function of the time constant circuit 62. The reference voltage circuit 66 is designed to generate the reference voltage for distinguishing the case where the vibrator 12 is rotated and the case where not rotated. Furthermore, the drift suppressing circuit 60 includes a comparator 68. In the comparator 68, the output signal of the differential circuit 64 and the reference voltage generated in the reference voltage circuit 66 are compared. By this compared value, the switching function of the time constant circuit 62 is controlled.

Figure 4:
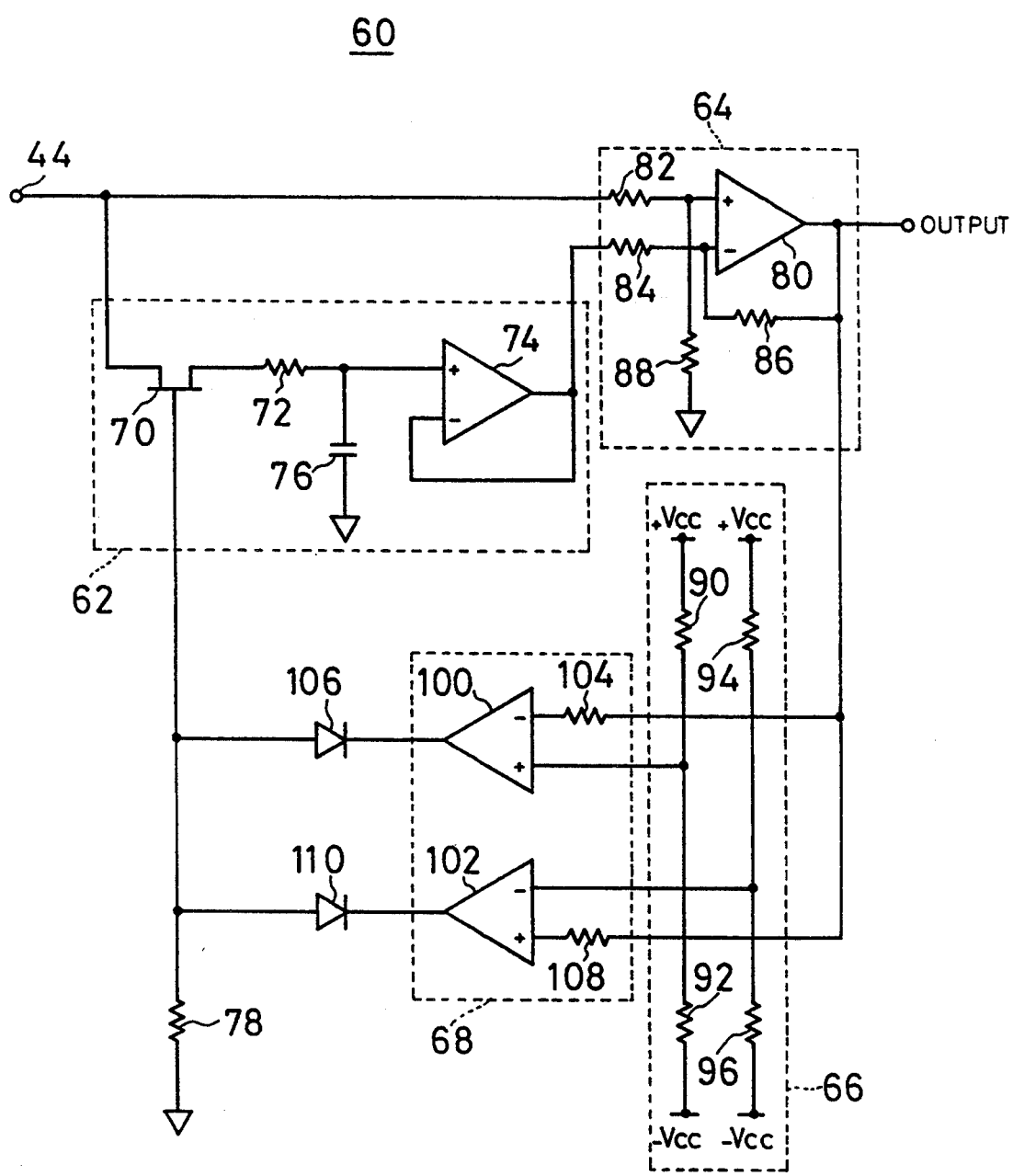
FIG. 4 is a circuit diagram showing an example of a drift suppressing circuit of a vibrating gyroscope shown in FIG. 3.

One example of the drift suppressing circuit 60 is shown in FIG. 4. In FIG. 4, inverse triangles designate intermediate points of the supply voltage. The output of the rectifier amplifying circuit 44 is input to the time constant circuit 62 and to the differential circuit 64. The time constant circuit 62 includes an FET 70 which performs the switching function. As the FET 70, for example, an N-channel FET is used. The output terminal of the rectifier amplifying circuit 44 is connected to a resistor 72 via the FET 70. The resistor 72 is connected to a non-inverse input terminal of an operational amplifier 74 as well as to the intermediate point of the supply voltage via a capacitor 76. The signal is fed back to its inverse input terminal from the output terminal of the operational amplifier 74. A gate of the FET 70 is connected to the intermediate point of the supply voltage via a resistor 78.

The differential circuit 64 includes an operational amplifier 80. The output terminal of the rectifier amplifying circuit 44 is connected to a non-inverse input terminal of the operational amplifier 80 via a resistor 82. The output terminal of the operational amplifier 74 of the time constant circuit 62 is connected to an inverse input terminal of the operational amplifier 80 via a resistor 84. The signal is fed back to the inverse input terminal of the operational amplifier 80 from its output terminal via a resistor 86. The non-inverse input terminal of the operational amplifier 80 is connected to the intermediate point of the supply voltage via a resistor 88.

The reference voltage circuit 66 includes resistors 90, 92 and resistors 94, 96 connected between power supplies +Vcc and −Vcc. A voltage obtained by division in the resistors 90 and 92 is set slightly higher than the intermediate point between the supply voltages. A voltage obtained by division in the resistors 94 and 96 is set slightly lower than the intermediate point between the supply voltages. The voltage obtained by division in these resistors are the reference voltages. These reference voltages are input to the comparator 68.

The comparator 68 includes two operational amplifiers 100 and 102. An output terminal of the operational amplifier 80 of the differential circuit 64 is connected to an inverse input terminal of one operational amplifier 100 via a resistor 104. Meanwhile, a high reference voltage divided in the resistors 90 and 92 is input to a non-inverse input terminal of the operational amplifier 100. An output terminal of the operational amplifier 100 is connected to a cathode of a diode 106, an anode of this connected to the gate of the FET 70. A low reference voltage divided in the resistors 94 and 96 is input to an inverse input terminal of the other operational amplifier 102. Meanwhile, the output terminal of the operational amplifier 80 of the differential circuit 64 is connected to a non-inverse input terminal of the operational amplifier 102 via a resistor 108. An output terminal of the operational amplifier 102 is connected to a cathode of a diode 110, an anode of this is connected to the gate of the FET 70.

The operation of the drift suppressing circuit 60 is described. In the case where the vibrator 12 is not rotating, as shown in an area (a) of FIG. 5(A), the drift components are produced gradually during a long time. The drift components are output from the rectifier amplifying circuit 44 and input to the time constant circuit 62 and the differential circuit 64. At this time, the FET 70 is ON and the drift components are charged to the capacitor 76 via the resistor 72. An output signal is output from the operational amplifier 74 by the voltage of the capacitor 76. Though the time constant circuit 62 includes a time constant by the resistor 72 and the capacitor 76, since the drift components change gradually during a long time, as shown in FIG. 5(B), the output signal of the operational amplifier 74 changes substantially the same as the drift components. Hence, the output of the differential circuit 64 becomes substantially zero.

Though the output of the differential circuit 64 is input to the comparator 68, since its value is zero, it is within the range of two reference voltages. Hence, the output signals of the operational amplifiers 100 and 102 of the comparator 68 become larger than the intermediate point of the supply voltage, and the FET 70 maintains the ON state. As such, in the case where the output signal of the gyroscope is only the drift components, as shown in FIG. 5(C), the output of the differential circuit 64 is maintained at zero.

When the vibrator 12 is rotated, as shown in a range (b) of FIG. 5(A), for example, a positive signal is output from the rectifier amplifying circuit 44. In this case, due to the time constant of the time constant circuit 62, a signal responding to the rotation is not output soon from the operational amplifier 74. Hence, the output signal of the differential circuit 64 is a value obtained by subtracting the drift components from the output signal of the rectifier amplifying circuit 44, that is, only the signal responding to the rotation.

This signal has a larger value than the high reference voltage generated in the reference voltage circuit 66, and the output signal of one operational amplifier 100 is reversed. Hence, a low voltage is applied to the gate of the FET 70, the FET 70 turns into the OFF state. When the FET 70 is in the OFF state, the output signal of the rectifier amplifying circuit 44 is not input to the time constant circuit 62, and the signal responding to the voltage of the capacitor 76 charged hitherto is output from the operational amplifier 74. Since this output signal is the signal input before the FET 70 turns into the OFF state, it has the value responding to the drift components. Thus, as shown in FIG. 5(B), the drift components just before the OFF state of the FET 70 is output. That is, during the OFF state of the FET 70, the drift components input hitherto is retained. Hence, as shown in FIG. 5(C), a value obtained by subtracting the drift components, that is, only the output signal responding to the rotation is output from the differential circuit 64. Thus, by measuring this output signal, the output responding accurately to the rotational angular velocity and not including the drift components can be obtained.

When the vibrator 12 is again not rotating, as shown in a range (c) of FIG. 5(A), since only the drift components are input to the differential circuit 64, the difference with the output signal of the time constant circuit 62 becomes zero. Hence, the output signal of the operational amplifier 100 of the comparator 68 returns to the origin and the FET 70 turns into the ON state. Thereby, as shown in FIG. 5(B) and FIG. 5(C), the drift suppressing circuit 60 turns into the state described in the beginning, and the output signal of the differential circuit 64 becomes zero. Though it is believed that the drift components changes even when the vibrator 12 is rotating, since usually the detecting time of the rotational angular velocity is very short as compared with the changing time of the drift components, it is believed that the difference in drift components before and after detection of the rotational angular velocity is negligible. Thus, by using the drift suppressing circuit 60, an accurate rotational angular velocity can be detected.

In the case of reversed rotating direction of the vibrator 12, the output signal of the rectifier amplifying circuit 44 becomes negative. Hence, the output of the differential circuit 64 also becomes lower and smaller than the low reference voltage obtained in the reference voltage circuit 66. In this case, the output of the other operational amplifier 102 inverse and the FET 70 turns into the OFF state. As such, regardless of the rotating direction of the vibrator 12, by using the drift suppressing circuit 60, the rotational angular velocity can be detected accurately.

In the aforementioned embodiments, though the vibrating gyroscope having a right triangular prism-shaped vibrating body has been described, the drift suppressing circuit of the present invention can also be applied in the vibrating gyroscope using the vibrating body having other shapes such as a quadrangular prism shape. It is to be understood that, the number of piezoelectric elements formed on the vibrating body may be changed optionally, and may be applied not only in the self-oscillating gyroscope but also in the separately-oscillating gyroscope. Furthermore, the drift suppressing circuit can also eliminate drift components of the gyroscope such as an optional fiber type, a gas rate type, a rotational gyroscope and the like besides the vibrating gyroscope.

While the present invention has been particularly described and shown, it is to be understood that such description is used merely as an illustration and example rather than limitation, and the spirit and scope of the present invention is determined solely by the terms of the appended claims.

What is claimed is:

1. A drift suppressing circuit of a gyroscope for suppressing drift components included in an output of the gyroscope, said drift suppressing circuit comprising:
    a first differential circuit having a same frequency characteristic for all frequencies, the output of said gyroscope is input to a first input terminal of said first differential circuit and said first differential circuit having an output;
    a second differential circuit having a frequency characteristic, on a higher frequency side above a specific frequency, which is different from the frequency characteristic of said first differential circuit, the output of said gyroscope is input to a first input terminal of said second differential circuit and said second differential circuit having an output;
    a comparison circuit for comparing the output of said first differential circuit and the output of said second differential circuit; and
    a sampling hold circuit for outputting a correction signal for suppressing said drift components included in the output of said gyroscope, said sampling hold circuit for holding and for outputting the output of said gyroscope as the correction signal when the output of said first differential circuit and the output of said second differential circuit compared by said comparison circuit are substantially equal, and said sampling hold circuit for outputting the held output of the gyroscope as the correction signal when the outputs of first and second differential circuits are not substantiality equal, said correction signal input to a second input terminal of said first differential circuit and to a second input terminal of said second differential circuit.

2. A drift suppressing circuit of a gyroscope according to claim 1, wherein
    said second differential circuit outputs an amplified signal in a high frequency band as compared with said first differential circuit.

3. A drift suppressing circuit of a gyroscope according to claim 1, wherein
    said second differential circuit outputs an attenuated signal in a high frequency band as compared with said first differential circuit.

4. A drift suppressing circuit of a gyroscope according to claim 1 wherein the same frequency characteristic is a constant amplification degree for all frequencies.

5. A drift suppressing circuit of a gyroscope for suppressing drift components included in an output of the gyroscope, said drift suppressing circuit comprising:
- a time constant circuit having a switching function which controls an input from said gyroscope and having a hold function which holds the input from said gyroscope and said time constant circuit outputting a signal, delayed by a time constant, from the input signal;
- a differential circuit for outputting a difference between the output of said gyroscope and the output of said time constant circuit;
- a reference voltage circuit for generating a reference voltage, said reference Voltage used for determining a difference between the output of said gyroscope and said drift components; and
- a comparator for comparing the reference voltage, generated in said reference voltage circuit, and the output of said differential circuit to switch the time constant circuit.

6. A drift suppressing circuit of a gyroscope according to claim 5, wherein
the switching function of said time constant circuit is given by a switching element which switches by a signal from said comparator, and said hold function and said time constant are given by combination of a resistor and a capacitor.

7. A drift suppressing circuit of a gyroscope according to claim 6, wherein said switching element is FET.

8. A drift suppressing circuit of a gyroscope according to claim 6, wherein
the reference voltage generated in said reference voltage circuit is a value having a fixed range of voltage.

9. A drift suppressing circuit of a gyroscope according to claim 8, wherein
a signal is input to said time constant circuit from said gyroscope when the output of said differential circuit is within the range of said reference voltage, and a signal is not input to said time constant circuit from said gyroscope when the output of said differential circuit is outside of the range of said reference voltage.

10. A drift suppressing circuit of a gyroscope according to claim 5, wherein
the reference voltage generated in said reference voltage circuit is a value having a fixed range of voltage.

11. A drift suppressing circuit of a gyroscope according to claim 10 wherein
a signal is input to said time constant circuit from said gyroscope when the output of said differential circuit is within the range of said reference voltage, and a signal is not input to said time constant circuit from said gyroscope when the output of said differential circuit is outside of the range of said reference voltage.

* * * * *